(12) United States Patent
Lingampalli et al.

(10) Patent No.: US 10,431,467 B2
(45) Date of Patent: *Oct. 1, 2019

(54) MODULE INCLUDING METALLIZED CERAMIC TUBES FOR RF AND GAS DELIVERY

(71) Applicant: LAM RESEARCH CORPORATION, Fremont, CA (US)

(72) Inventors: Ramkishan Rao Lingampalli, Danville, CA (US); Joel Hollingsworth, Portland, OR (US); Bradley Baker, Tualatin, OR (US)

(73) Assignee: Lam Research Corporation, Fremont, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/196,147

(22) Filed: Nov. 20, 2018

(65) Prior Publication Data

US 2019/0109008 A1    Apr. 11, 2019

Related U.S. Application Data

(63) Continuation of application No. 15/608,135, filed on May 30, 2017, now Pat. No. 10,147,610.

(51) Int. Cl.
*H01L 21/285* (2006.01)
*C23C 16/455* (2006.01)
(Continued)

(52) U.S. Cl.
CPC ...... *H01L 21/28556* (2013.01); *C23C 16/045* (2013.01); *C23C 16/4586* (2013.01);
(Continued)

(58) Field of Classification Search
None
See application file for complete search history.

(56) References Cited

U.S. PATENT DOCUMENTS

| 5,476,548 A | 12/1995 | Lei et al. |
| 5,671,116 A | 9/1997 | Husain |

(Continued)

FOREIGN PATENT DOCUMENTS

JP    2012-089694 A    5/2012

*Primary Examiner* — Lex H Malsawma
(74) *Attorney, Agent, or Firm* — Schwegman Lundberg & Woessner, P.A.

(57) ABSTRACT

A semiconductor substrate processing apparatus includes a vacuum chamber having a processing zone in which a semiconductor substrate may be processed, a process gas source in fluid communication with the vacuum chamber for supplying a process gas into the vacuum chamber, a showerhead module through which process gas from the process gas source is supplied to the processing zone of the vacuum chamber, and a substrate pedestal module. The substrate pedestal module includes a pedestal made of ceramic material having an upper surface configured to support a semiconductor substrate thereon during processing, a stem made of ceramic material, and a backside gas tube made of metallized ceramic material that is located in an interior of the stem. The metallized ceramic tube can be used to deliver backside gas to the substrate and supply RF power to an embedded electrode in the pedestal.

11 Claims, 8 Drawing Sheets

(51) Int. Cl.
*C23C 16/509* (2006.01)
*C23C 16/515* (2006.01)
*C23C 16/04* (2006.01)
*C23C 16/458* (2006.01)
*C23C 16/46* (2006.01)

(52) U.S. Cl.
CPC .. *C23C 16/45514* (2013.01); *C23C 16/45538* (2013.01); *C23C 16/45565* (2013.01); *C23C 16/46* (2013.01); *C23C 16/509* (2013.01); *C23C 16/515* (2013.01)

(56) References Cited

U.S. PATENT DOCUMENTS

| | | | |
|---|---|---|---|
| 5,688,331 A | 11/1997 | Aruga et al. |
| 5,810,933 A | 9/1998 | Mountsier et al. |
| 5,968,379 A | 10/1999 | Zhao et al. |
| 6,082,297 A | 7/2000 | Pollock et al. |
| 6,086,246 A | 7/2000 | Shufflebotham et al. |
| 6,103,074 A | 8/2000 | Khominich |
| 6,126,382 A | 10/2000 | Scales et al. |
| 6,281,144 B1 | 8/2001 | Cleary et al. |
| 6,376,808 B2 | 4/2002 | Tachikawa et al. |
| 6,423,949 B1 | 7/2002 | Chen et al. |
| 6,468,384 B1 | 10/2002 | Singh et al. |
| 6,494,955 B1 | 12/2002 | Lei et al. |
| 6,561,796 B1 | 5/2003 | Barrera et al. |
| 6,646,233 B2 | 11/2003 | Kanno et al. |
| 6,860,965 B1 | 3/2005 | Stevens |
| 6,899,789 B2 | 5/2005 | Tamura et al. |
| 7,138,606 B2 | 11/2006 | Kanno et al. |
| 7,154,731 B1 | 12/2006 | Kueper |
| 7,274,006 B2 | 9/2007 | Okajima et al. |
| 7,326,886 B2 | 2/2008 | Inoue |
| 7,327,948 B1 | 2/2008 | Shrinivasan et al. |
| 7,558,045 B1 | 7/2009 | Onate et al. |
| 7,667,944 B2 | 2/2010 | Naim |
| 7,697,260 B2 | 4/2010 | Brown et al. |
| 7,848,075 B2 | 12/2010 | Nobori et al. |
| 7,941,039 B1 | 5/2011 | Shrinivasan et al. |
| 7,981,218 B2 | 7/2011 | Yamashita |
| 8,052,419 B1 | 11/2011 | Nordin et al. |
| 8,071,920 B2 | 12/2011 | Shimanuki et al. |
| 8,197,638 B2 | 6/2012 | Ishisaka et al. |
| 8,206,552 B2 | 6/2012 | Chen et al. |
| 8,371,567 B2 | 2/2013 | Angelov et al. |
| 8,597,448 B2 | 12/2013 | Hart et al. |
| 8,618,446 B2 | 12/2013 | Chang et al. |
| 8,753,447 B2 | 6/2014 | Lind et al. |
| 8,840,754 B2 | 9/2014 | Hao |
| 8,848,335 B2 | 9/2014 | Hori et al. |
| 8,851,463 B2 | 10/2014 | Angelov et al. |
| 8,908,399 B2 | 12/2014 | Gamet et al. |
| 8,920,162 B1 | 12/2014 | Nordin et al. |
| 8,968,503 B2 | 3/2015 | Hart et al. |
| 9,064,911 B2 | 6/2015 | Roy et al. |
| 9,088,085 B2 | 7/2015 | Lind |
| 9,117,867 B2 | 8/2015 | Hwang et al. |
| 9,337,067 B2 | 5/2016 | Roy et al. |
| 9,349,630 B2 | 5/2016 | Raj et al. |
| 9,428,833 B1 | 8/2016 | Duvall et al. |
| 9,428,836 B2 | 8/2016 | Norkus et al. |
| 9,490,150 B2 | 11/2016 | Tzu et al. |
| 10,147,610 B1 * | 12/2018 | Lingampalli ..... H01L 21/28556 |
| 2003/0136520 A1 | 7/2003 | Yudovsky et al. |
| 2004/0194710 A1 | 10/2004 | Hanamachi et al. |
| 2008/0062609 A1 | 3/2008 | Himori et al. |
| 2010/0224130 A1 | 9/2010 | Smith et al. |
| 2011/0162799 A1 | 7/2011 | Hayashi |
| 2012/0103970 A1 | 5/2012 | Lubomirsky et al. |
| 2012/0164834 A1 | 6/2012 | Jennings et al. |
| 2013/0092086 A1 | 4/2013 | Keil et al. |
| 2013/0340937 A1 | 12/2013 | Yamazawa et al. |
| 2014/0014642 A1 | 1/2014 | Elliot et al. |
| 2016/0002779 A1 | 1/2016 | Lin et al. |
| 2016/0099164 A1 | 4/2016 | Kataigi et al. |
| 2016/0172227 A1 | 6/2016 | Hanson et al. |
| 2016/0322215 A1 | 11/2016 | Shaikh |
| 2016/0329230 A1 | 11/2016 | Raj et al. |
| 2016/0333475 A1 | 11/2016 | Gomm et al. |
| 2016/0336213 A1 | 11/2016 | Gomm et al. |
| 2016/0340781 A1 | 11/2016 | Thomas et al. |
| 2017/0040198 A1 | 2/2017 | Lin et al. |
| 2017/0121819 A1 | 5/2017 | Swaminathan et al. |
| 2017/0133245 A1 | 5/2017 | Iizuka |
| 2017/0133258 A1 | 5/2017 | Miwa et al. |
| 2017/0141002 A1 | 5/2017 | Karim et al. |

* cited by examiner

MODULE INCLUDING METALLIZED CERAMIC TUBES FOR RF AND GAS DELIVERY

CROSS REFERENCE TO RELATED APPLICATIONS

This application is a continuation application of U.S. patent application Ser. No. 15/608,135, filed May 30, 2017, the entire content of which is hereby incorporated by reference.

FIELD OF THE INVENTION

This invention pertains to semiconductor substrate processing apparatuses for processing semiconductor substrates, and may find particular use in plasma-enhanced chemical vapor depositions processing apparatuses operable to deposit thin films.

BACKGROUND

Semiconductor substrate processing apparatuses are used to process semiconductor substrates by techniques including etching, physical vapor deposition (PVD), chemical vapor deposition (CVD), plasma-enhanced chemical vapor deposition (PECVD), atomic layer deposition (ALD), plasma-enhanced atomic layer deposition (PEALD), pulsed deposition layer (PDL), plasma-enhanced pulsed deposition layer (PEPDL), and resist removal. One type of semiconductor substrate processing apparatus is a plasma processing apparatus that includes a reaction chamber containing upper and lower electrodes wherein a radio frequency (RF) power is applied between the electrodes to excite a process gas into plasma for processing semiconductor substrates in the reaction chamber.

SUMMARY

Disclosed herein is a semiconductor substrate processing apparatus for processing semiconductor substrates, comprising a vacuum chamber including a processing zone in which a semiconductor substrate may be processed; a process gas source in fluid communication with the vacuum chamber for supplying a process gas into the vacuum chamber; a showerhead module through which process gas from the process gas source is supplied to the processing zone of the vacuum chamber; and a substrate pedestal module including a platen made of ceramic material having an upper surface configured to support a semiconductor substrate thereon during processing; a stem made of ceramic material having an upper stem flange that supports the platen; and at least one backside gas tube made of metallized ceramic material that is located in an interior of the stem, the backside gas tube configured to supply backside gas to the upper surface of the platen and supply power to an electrode embedded in the platen.

According to an embodiment, the electrode is an electrostatic clamping electrode, an RF electrode or combination thereof. The platen can include one or more resistance heaters embedded therein wherein the heaters are electrically connected to metal feed rods or metallized ceramic feed rods located inside the stem. The substrate pedestal module can further include a thermocouple configured to measure temperature of the platen wherein the thermocouple is located inside a ceramic tube attached to an underside of the platen at a location inside the stem. Preferably, the backside gas tube, the platen and the stem are formed of the same ceramic material such as aluminum nitride and/or the backside gas tube is centrally located in the interior of the stem. In an exemplary embodiment, the platen includes an outer RF electrode embedded therein and inner electrostatic clamping (ESC) electrodes embedded therein, the inner ESC electrodes coplanar with the outer RF electrode, the outer RF electrode including a radially extending feed strip electrically connected to a metallized ceramic tube inside the stem, and the inner ESC electrodes electrically connected to a pair of metallized ceramic feed rods or metallized ceramic feed tubes inside the stem. In another embodiment, the metallized ceramic tube is connected to the electrode by a stress relief connection, the stress relief connection configured to change shape to accommodate differential thermal expansion between the metallized ceramic tube and the electrode. The metallized ceramic tube can have a length greater than a length of the stem and/or include an electrically conductive coating on an outer surface thereof.

In an exemplary embodiment, the at least one backside gas tube comprises first, second and third metallized ceramic tubes and the platen includes first, second and third coplanar electrodes wherein the first electrode is an outer ring-shaped electrode having a diagonally extending feed strip electrically connected to the first metalized ceramic tube and the second and third electrodes are inner D-shaped electrodes electrically connected to the second and third metallized ceramic tubes. The first metallized ceramic tube can be in fluid communication with a first gas passage extending though the diagonally extending feed strip and a first outlet at a center of an upper surface of the platen. The second metallized ceramic tube can be in fluid communication with a second gas passage extending through the second electrode and a second outlet in the upper surface of the platen at a first distance from the first outlet. The third metallized ceramic tube can be in fluid communication with a third gas passage extending through the third electrode and a third outlet in the upper surface of the platen at a second distance from the first outlet, wherein the first and second distances are no greater than about 1 inch.

Also disclosed herein is a semiconductor substrate support module useful for processing semiconductor substrates in a vacuum chamber including a processing zone in which a semiconductor substrate may be processed. The substrate support module comprises a platen made of ceramic material having an upper surface configured to support a semiconductor substrate thereon during processing; a stem made of ceramic material having an upper stem flange that supports the platen; and a backside gas tube made of metallized ceramic material that is located in an interior of the stem, the backside gas tube configured to supply backside gas to the upper surface of the platen and supply power to an electrode embedded in the platen.

BRIEF DESCRIPTION OF THE DRAWING FIGURES

DETAILED DESCRIPTION

In the following detailed description, numerous specific embodiments are set forth in order to provide a thorough understanding of the apparatus and methods disclosed herein. However, as will be apparent to those skilled in the art, the present embodiments may be practiced without these specific details or by using alternate elements or processes. In other instances, well-known processes, procedures, and/or components have not been described in detail so as not to unnecessarily obscure aspects of embodiments disclosed herein. As used herein the term "about" refers to ±10%.

As indicated, present embodiments provide apparatus and associated methods for processing a semiconductor substrate in a semiconductor substrate processing apparatus such as a chemical vapor deposition apparatus or a plasma-enhanced chemical vapor deposition apparatus. The apparatus and methods are particularly applicable for use in conjunction with high temperature processing of semiconductor substrates such as a high temperature deposition processes wherein a semiconductor substrate being processed is heated to temperatures greater than about 550° C., such as about 550° C. to about 650° C. or more.

Embodiments disclosed herein are preferably implemented in a plasma-enhanced chemical deposition apparatus (i.e. PECVD apparatus, PEALD apparatus, or PEPDL apparatus), however, they are not so limited.

Figure 1:
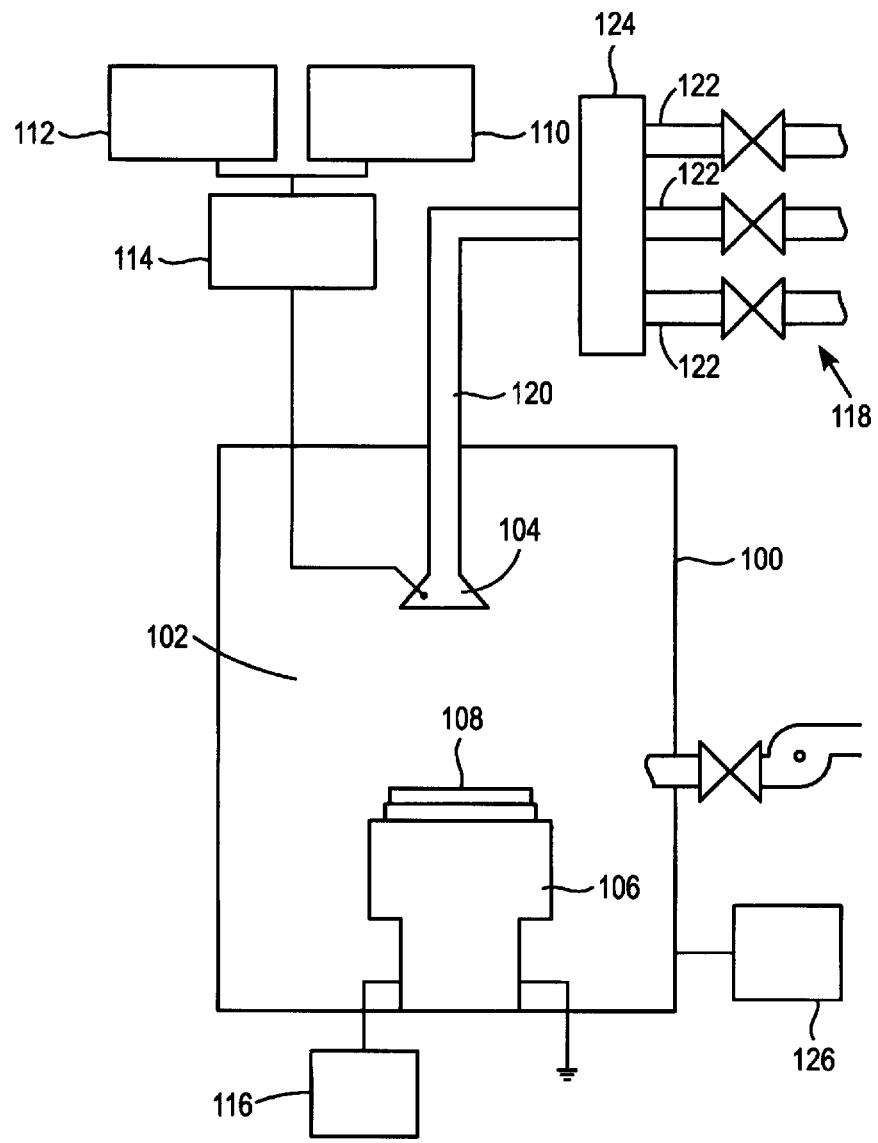
FIG. 1 illustrates a schematic diagram showing an overview of a chemical deposition apparatus in accordance with embodiments disclosed herein.

FIG. 1 provides a simple block diagram depicting various semiconductor substrate plasma processing apparatus components arranged for implementing embodiments as disclosed herein. As shown, a semiconductor substrate plasma processing apparatus 100 includes a vacuum chamber 102 that serves to contain plasma in a processing zone, which is generated by a capacitor type system including a showerhead module 104 having an upper RF electrode (not shown) therein working in conjunction with a substrate pedestal module 106 having a lower RF electrode (not shown) therein. At least one RF generator is operable to supply RF energy into a processing zone above an upper surface of a semiconductor substrate 108 in the vacuum chamber 102 to energize process gas supplied into the processing zone of the vacuum chamber 102 into plasma such that a plasma deposition process may be performed in the vacuum chamber 102. For example, a high-frequency RF generator 110 and a low-frequency RF generator 112 may each be connected to a matching network 114, which is connected to the upper RF electrode of the showerhead module 104 such that RF energy may be supplied to the processing zone above the semiconductor substrate 108 in the vacuum chamber 102.

The power and frequency of RF energy supplied by matching network 114 to the interior of the vacuum chamber 102 is sufficient to generate plasma from the process gas. In an embodiment both the high-frequency RF generator 110 and the low-frequency RF generator 112 are used, and in an alternate embodiment, just the high-frequency RF generator 110 is used. In a process, the high-frequency RF generator 110 may be operated at frequencies of about 2-100 MHz; in a preferred embodiment at 13.56 MHz or 27 MHz. The low-frequency RF generator 112 may be operated at about 50 kHz to 2 MHz; in a preferred embodiment at about 350 to 600 kHz. The process parameters may be scaled based on the chamber volume, substrate size, and other factors. Similarly, the flow rates of process gas, may depend on the free volume of the vacuum chamber or processing zone.

An upper surface of the substrate pedestal module 106 supports a semiconductor substrate 108 during processing within the vacuum chamber 102. The substrate pedestal module 106 can include a chuck to hold the semiconductor substrate and/or lift pins to raise and lower the semiconductor substrate before, during and/or after the deposition and/or plasma treatment processes. In an alternate embodiment, the substrate pedestal module 106 can include a carrier ring to raise and lower the semiconductor substrate before, during and/or after the deposition and/or plasma treatment processes. The chuck may be an electrostatic chuck, a mechanical chuck, or various other types of chuck as are available for use in the industry and/or research. Details of a lift pin assembly for a substrate pedestal module including an electrostatic chuck can be found in commonly-assigned U.S. Pat. No. 8,840,754, which is incorporated herein by reference in its entirety. Details of a carrier ring for a substrate pedestal module can be found in commonly-assigned U.S. Pat. No. 6,860,965, which is incorporated herein by reference in its entirety. A backside gas supply 116 is operable to supply a heat transfer gas or purge gas through the substrate pedestal module 106 to a region below a lower surface of the semiconductor substrate during processing. The substrate pedestal module 106 includes the lower RF electrode therein wherein the lower RF electrode is preferably grounded during processing, however in an alternate embodiment, the lower RF electrode may be supplied with RF energy during processing.

To process a semiconductor substrate in the vacuum chamber 102 of the semiconductor substrate plasma processing apparatus 100, process gases are introduced from a process gas source 118 into the vacuum chamber 102 via inlet 120 and showerhead module 104 wherein the process gas is formed into plasma with RF energy such that a film may be deposited onto the upper surface of the semiconductor substrate. In an embodiment, multiple source gas lines 122 may be connected to a heated manifold 124. The gases may be premixed or supplied separately to the chamber. Appropriate valving and mass flow control mechanisms are employed to ensure that the correct gases are delivered through the showerhead module 104 during semiconductor substrate processing. During the processing, a backside heat transfer gas or purge gas is supplied to a region below a lower surface of the semiconductor substrate supported on the substrate pedestal module 102. Preferably, the processing is at least one of chemical vapor deposition processing, plasma-enhanced chemical vapor deposition processing, atomic layer deposition processing, plasma-enhanced atomic layer deposition processing, pulsed deposition layer processing, or plasma-enhanced pulsed deposition layer processing.

In certain embodiments, a system controller 126 is employed to control process conditions during deposition, post deposition treatments, and/or other process operations. The controller 126 will typically include one or more memory devices and one or more processors. The processor may include a CPU or computer, analog and/or digital input/output connections, stepper motor controller boards, etc.

In certain embodiments, the controller 126 controls all of the activities of the apparatus. The system controller 126 executes system control software including sets of instructions for controlling the timing of the processing operations, frequency and power of operations of the low-frequency RF generator 112 and the high-frequency RF generator 110, flow rates and temperatures of precursors and inert gases and their relative mixing, temperature of a semiconductor substrate 108 supported on an upper surface of the substrate pedestal module 106 and a plasma exposed surface of the showerhead module 104, pressure of the vacuum chamber 102, and other parameters of a particular process. Other computer programs stored on memory devices associated with the controller may be employed in some embodiments.

Disclosed herein is a ceramic pedestal for sequential processing of individual semiconductor wafers wherein one or more metallized ceramic tubes (AlN, $Al_2O_3$, $Si_3N_4$, $ZrO_2$, SiC or other ceramic materials may be appropriate) serve as both an electrical connection for RF or heater (AC) power, and to supply backside gases into the wafer chuck cavity. Current practice is that RF power & heater (AC) power connections are rods which are solid metallic materials, connected to the pedestal via a tubular stem that mechanically supports the pedestal and isolates electrical connections from the process chamber. See, for example, commonly-assigned U.S. Patent Publication Nos. 2016/0340781; 2016/0336213; and 2016/0333475, each of which is hereby incorporated by reference in its entirety. Current technology uses solid Ni rods for RF & Heater (AC) power without the backside gas option because of space constraints in the shaft prevent the addition of a gas line. That is, space in the stem area is constrained, such that it is difficult to fit additional features (rods/tubes) for new purposes such as backside gas delivery to the wafer cooling/edge purge gases. Therefore using one part for two purposes allows new functionality to be added to the pedestal with minimal change to form factor.

In accordance with an embodiment, a metallized ceramic tube serves dual two purposes of (a) RF or AC power delivery and (B) bringing backside gases into chamber. A preferred embodiment of the tube is a ceramic material approximately matching the CTE of the pedestal itself, which can be accomplished by choosing a material of similar composition (e.g. for an AlN pedestal, choose an AlN tube; for a SiC pedestal, choose a SiC tube), or by using a phase mixture of materials including at least one phase with greater CTE than the pedestal and at least one phase with lesser CTE than the pedestal, in proportions that allow the volumetric average of CTE to approximately match the pedestal material. An alternative embodiment is to have a stress relief connection between pedestal and tube, capable of changing shape to accommodate CTE mismatch without breakage or other degradation, such as a metal or alloy whose creep temperature is less than the service temperature of the part, or a solder seal arranged such that surface tension is sufficient to maintain a seal and to prevent migration of liquid during operation.

In a preferred embodiment, the metallization is of a pure, nonmagnetic metal with low electrical resistivity and resistance to oxidation at service temperature, such as gold. Alternative embodiments include ferromagnetic metals which otherwise meet the above criteria, such as nickel (Ni); nonmetallic substances with low electrical conductivity, such as graphite (C) or titanium nitride (TiN); metals with conductive oxides, such as silver (Ag); alloys low electrical resistivity, such as aluminum bronze or dispersion-strengthened silver; multi-layer structures where the functions of oxidation resistance and electrical conduction are accomplished by different layers of material, such as TiN-coated copper; or structures where any metallization is protected from oxidation by a flow of oxygen-free gas, e.g. if the interior portion of the tube is metallized with Cu and the system is interlocked to prevent pedestal heating without gas flow.

Gases can be transported to the back of the wafer cavity via metallized ceramic tubular holes and metalized top surface to conduct RF or AC power delivery. This structure can also reduce thermal conductance from the hot zone of the pedestal as compared to solid metal conductors, improving thermal uniformity of the wafer, reducing risk of overheating components adjacent to the pedestal, and reducing heater power consumption.

Figure 2:
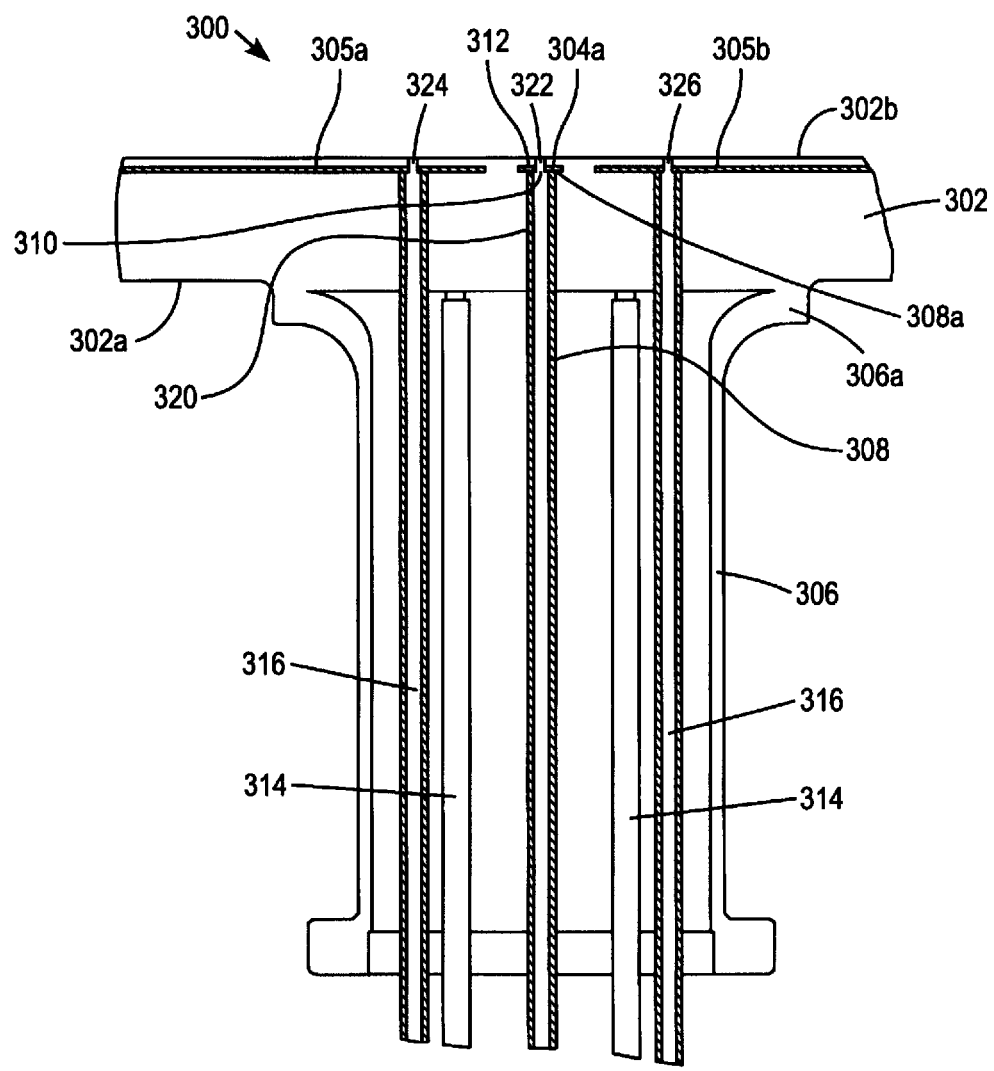
FIG. 2 shows a cross section of a substrate pedestal module in accordance with an embodiment as disclosed herein.

FIG. 2 illustrates a substrate support module 300 which includes a ceramic platen 302 having electrically conductive electrodes 305a, 305b such as an electrically conductive grids and feed strip electrode 304a which is electrically connected to an outer ring-shaped electrode (not shown) embedded therein and a hollow ceramic support stem 306. The platen 302 and stem 306 are preferably made of a ceramic material such as aluminum nitride and a bottom surface 302a of the platen 302 is joined to an upper end 306a of the stem 306 such as by brazing, friction welding, diffusion bonding, or other suitable technique. A centrally located metallized ceramic tube 308 is located inside the stem 306 with an upper end 308a of the tube 308 electrically connected to embedded feed strip electrode 304a. An outlet 310 of the tube 308 is in fluid communication with a gas passage 312 in a support surface 302b of the platen 302. The metallized ceramic tube 308 can be supplied an inert gas such as argon (Ar) or nitrogen ($N_2$) or a heat transfer gas such as helium (He) which is delivered via gas passage 312 through outlet 322 to an underside of a semiconductor substrate (not shown) located on support surface 302b. The outer surface of the tube 308 can be sealed to the platen 302 by a hermetic seal 320. The inside of the stem 306 also houses other components such as electrical feed rods 314 which deliver power to other electrodes such as resistance heaters (not shown) and additional metallized ceramic tubes 316 which deliver power to electrostatic clamping electrodes 305a, 305b in the platen 302. The metallized ceramic tubes 316 can also deliver gas through outlets 324, 326 to the underside of a wafer supported on the platen 302.

During processing of a semiconductor substrate such as deposition of films on a silicon wafer supported on the substrate support module 300, the platen 302 may cycle between temperatures ranging from about 20° C. to 500° C. and higher. For processing a 300 mm wafer, the platen 302 can have a thickness of up to about 1 inch and a diameter of about 15 inches, the stem 306 can have a diameter of about 3 inches and the distance between the bottom of the stem 306 and the upper surface of the platen 302 can be about 5 inches. The metallized ceramic tube can have a diameter of about 4 mm, a length of about 7 to 8 inches and the metallized coating can have a thickness of about 5 to 50 microns, preferably about 30 microns. The inside of the stem 306 accommodates components such as electrical feeds, at least one gas feed, and at least one thermocouple. In order to accommodate these components, the metalized ceramic tube 308 can deliver gas to the support surface and supply power to an embedded electrode thus eliminating the need for a separate gas feed. Where two or more gas feeds are desired, additional metallized ceramic tubes can be used to supply gas and power to embedded electrodes in addition, by using lower thermal conductivity ceramic tubes such as aluminum nitride tubes rather than high thermal conductivity metal rods such as palladium/rhodium (Pd/Rh) coated stainless steel or nickel (Ni) rods, it is possible to reduce transfer of heat from the platen 302.

Figure 3:
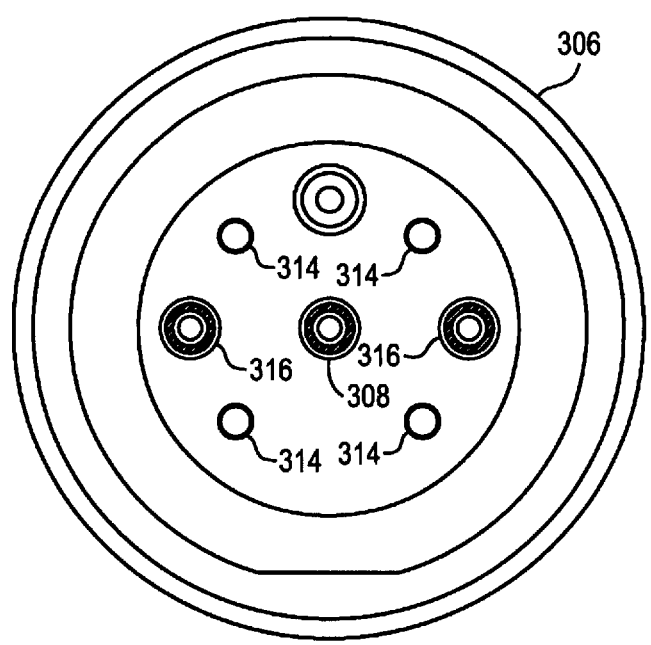
FIG. 3 illustrates a bottom view of the substrate pedestal module shown in FIG. 2.

FIG. 3 shows a bottom view of the substrate support module 300 wherein seven electrical feeds can be seen. In this embodiment, a center metallized ceramic tube 308 can supply power to a center electrode, four feed rods 314 can supply power to resistance heaters such as an inner resistance heater and an outer resistance heater (not shown), and two metallized ceramic tubes 316 can supply power to two electrodes such as two electrostatic chucking electrodes (not shown) embedded in the platen 302. The metallized ceramic tubes 316 can also deliver gas to the underside of a substrate supported on the platen 302 and/or supply RF energy to the electrostatic chucking electrodes.

Figure 4:
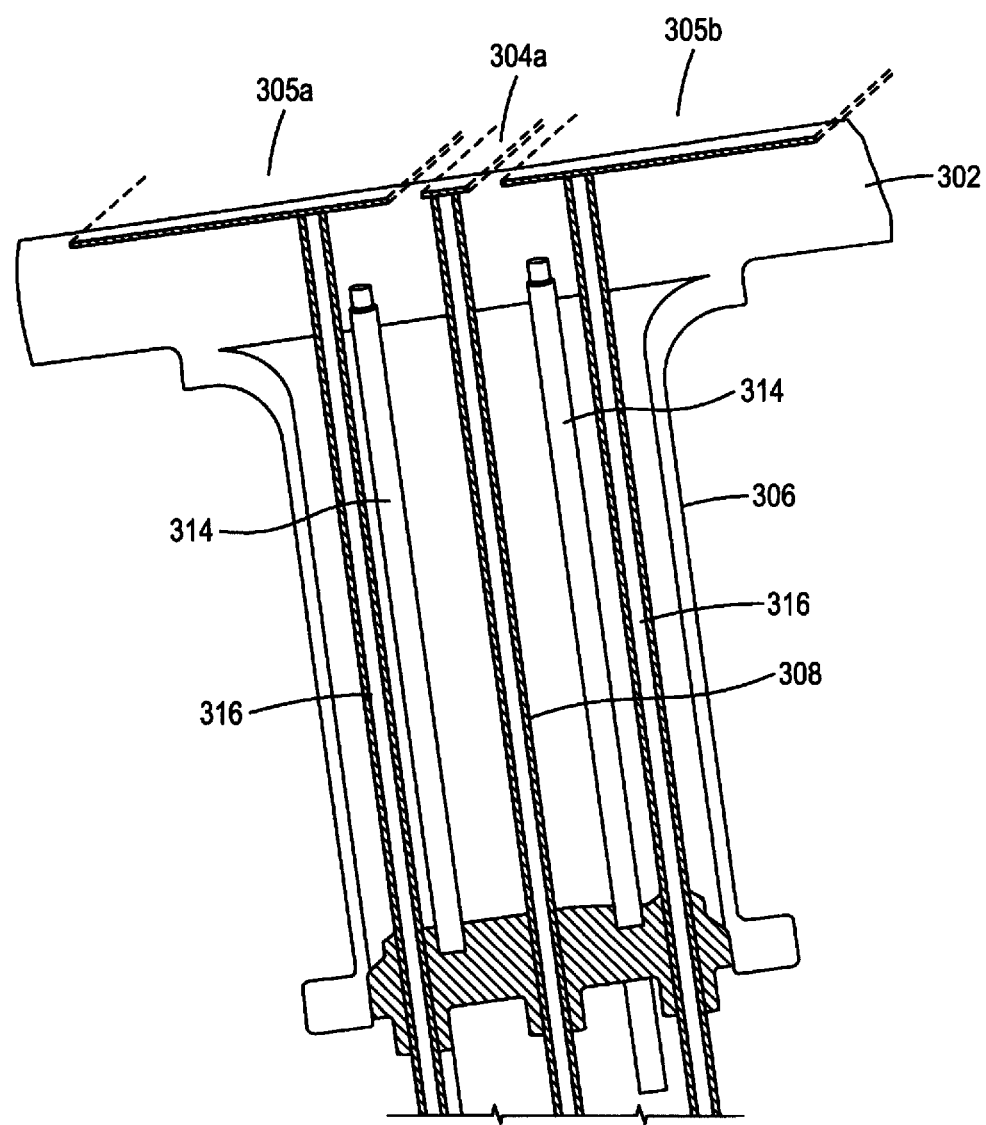
FIG. 4 is a cross-sectional perspective view of the substrate support module shown in FIG. 2.

FIG. 4 is a cut-away view of the substrate support module 300 wherein a single metallized ceramic tube 308 is located in the center of the platen 302, four solid feed rods 314 such as nickel (Ni) rods are circumferentially spaced apart at locations inward of an inner surface of the stem 306, and two metallized ceramic tubes 316 are electrically connected to electrostatic clamping electrodes 305a, 305b. The solid feed rods 314 can supply power to resistance heaters 318a, 318b (see FIG. 8) embedded in the platen 302 at a location below an outer ring-shaped electrode 304 (see FIG. 9) connected to the metallized ceramic tube 308 by feed strip 304a. Electrical connections between the metallized ceramic tubes 308, 316 and the electrodes 304, 305a, 305b and between the feed rods 314 and the heaters 318a, 318b can include solid terminals/studs/sockets as disclosed in commonly-assigned U.S. Pat. No. 9,088,085, the disclosure of which is hereby incorporated by reference. During manufacture of the substrate support module 300, the metallized ceramic tubes 308, 316 can be bonded to the platen 302 and electrodes 304, 305a, 305b via suitable sintering and/or brazing techniques.

Figure 5:
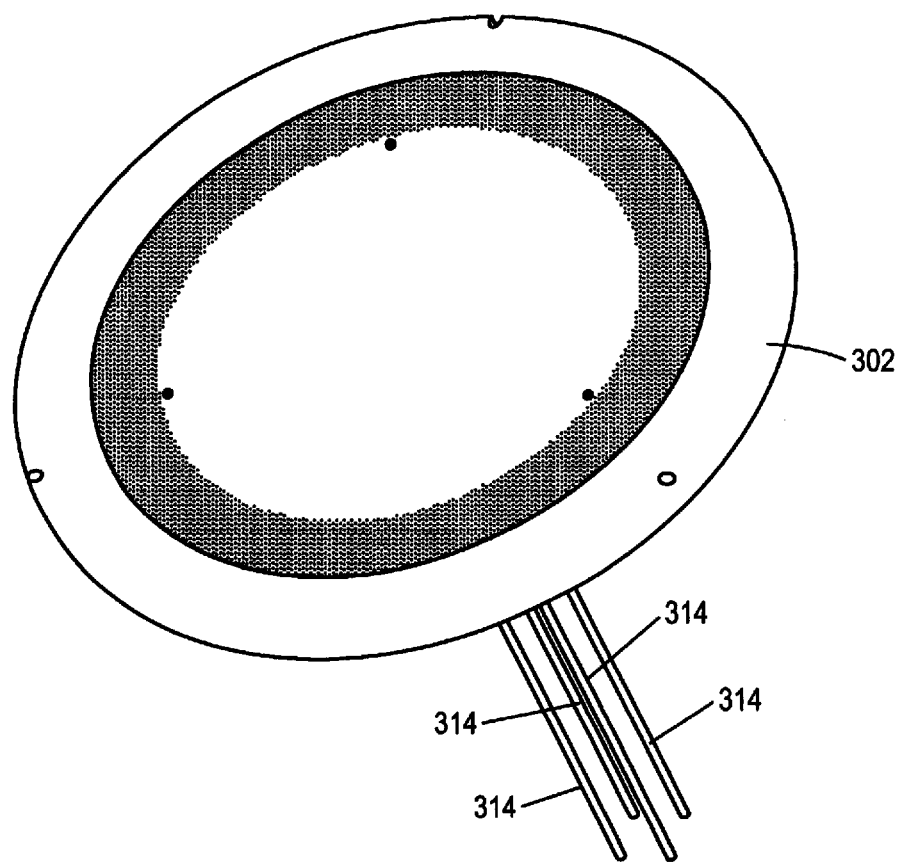
FIG. 5 is a top perspective view of the substrate support module shown in FIG. 2.

FIG. 5 is a top perspective view of the platen 302 prior to attachment of stem 306. However, stem 306 is preferably bonded to the platen 302 by high temperature brazing or diffusion bonding prior to attachment of the feed rods 314 and ceramic tube(s) 308/316. As shown, feed rods 314 extend from a lower surface of the platen and preferably the feed rods 314 and metallized ceramic tube(s) 308/316 extend a distance greater than the length of the stem 306. For example, the feed rods 314 and metallized ceramic tube(s) 308/316 can extend a distance of at least about 7 to 8 inches, e.g., about 7.25 inches from the lower surface 302a of the platen 302.

Figure 6:
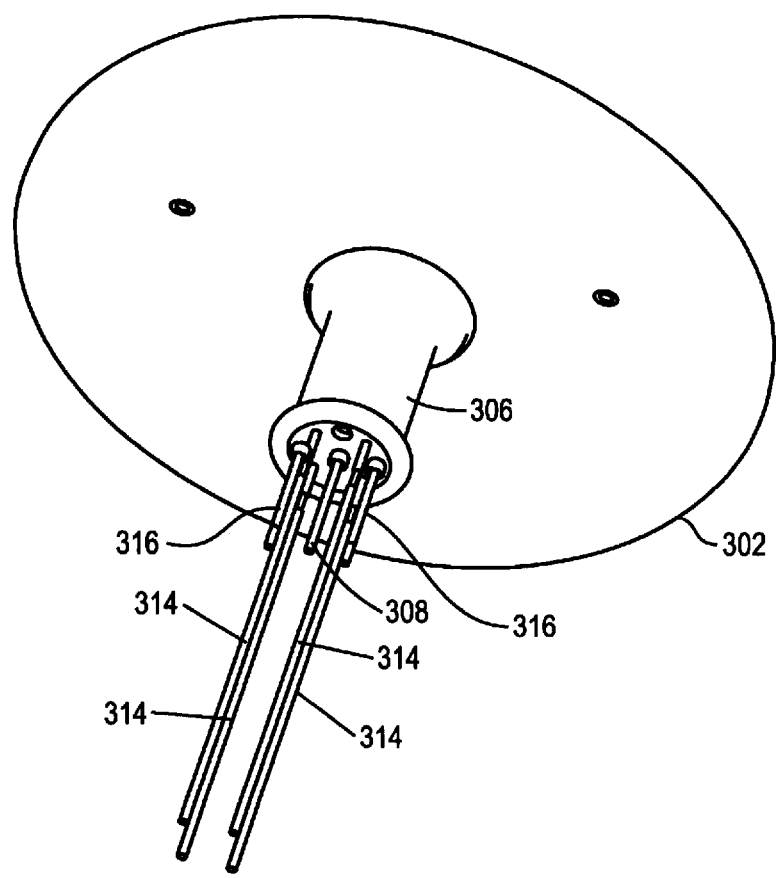
FIG. 6 is a bottom perspective view of the substrate support module shown in FIG. 2.

FIG. 6 shows a bottom perspective view of the substrate support module 300. As shown, metallized ceramic tube 308, feed rods 314 and metallized ceramic tubes 316 extend outward from a lower end of the stem 306.

Figure 7:
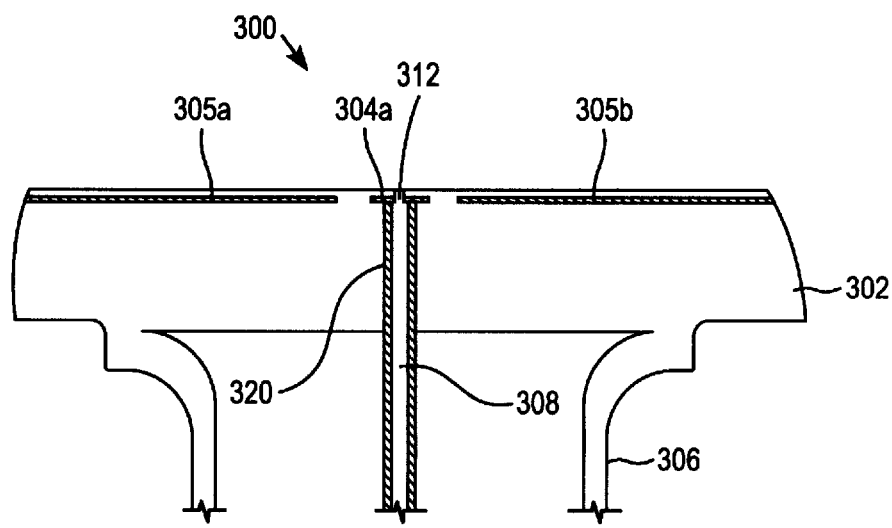
FIG. 7 is a cross-sectional view of a substrate support module having a single metallized ceramic tube inside the stem.

FIG. 7 is a cross-sectional view of the substrate support module 300. As shown, in this embodiment, the platen 302 includes a central feed strip electrode 304a electrically connected to the metallized ceramic tube 308 and connections to electrostatic electrodes 305a, 305b are not visible.

Figure 8:
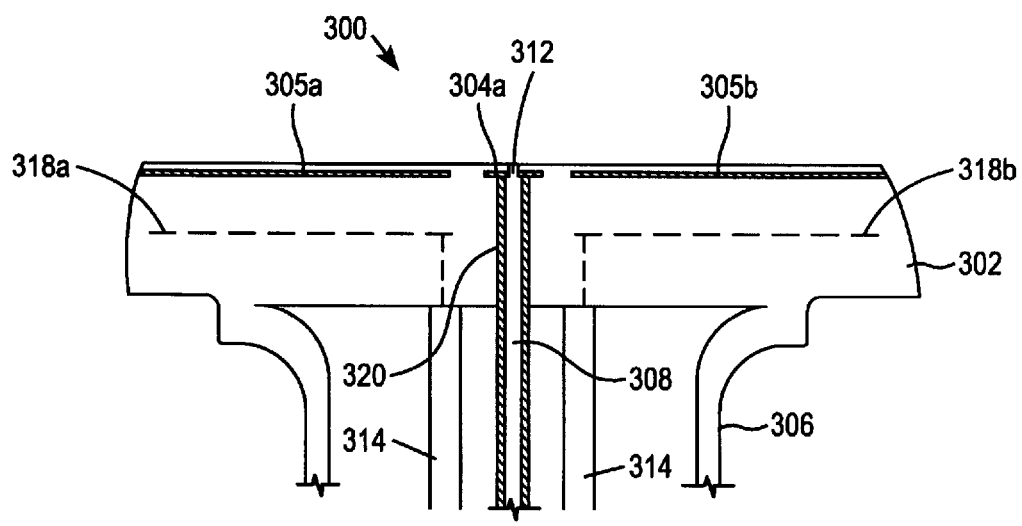
FIG. 8 is a cross-sectional view of a substrate support module having a metallized ceramic tube connected to an embedded RF electrode and two feed rods connected to two resistance heaters embedded in the pedestal at a location below the RF electrode.

FIG. 8 is a cross-sectional view of the substrate support module 300. A shown, the metallized ceramic tube 308 is electrically connected to feed strip electrode 304a and two feed rods 314 are electrically connected to one or more resistance heaters 318a, 318b embedded in the platen 302 at a location below the electrode 304. For instance, a pair of feed rods 314 can be connected to an inner heater and another pair of feed rods 314 can be connected to an outer heater. If desired a single heater or more than two heaters can be embedded in the platen 302 in any desired geometrical arrangement.

Figure 9:
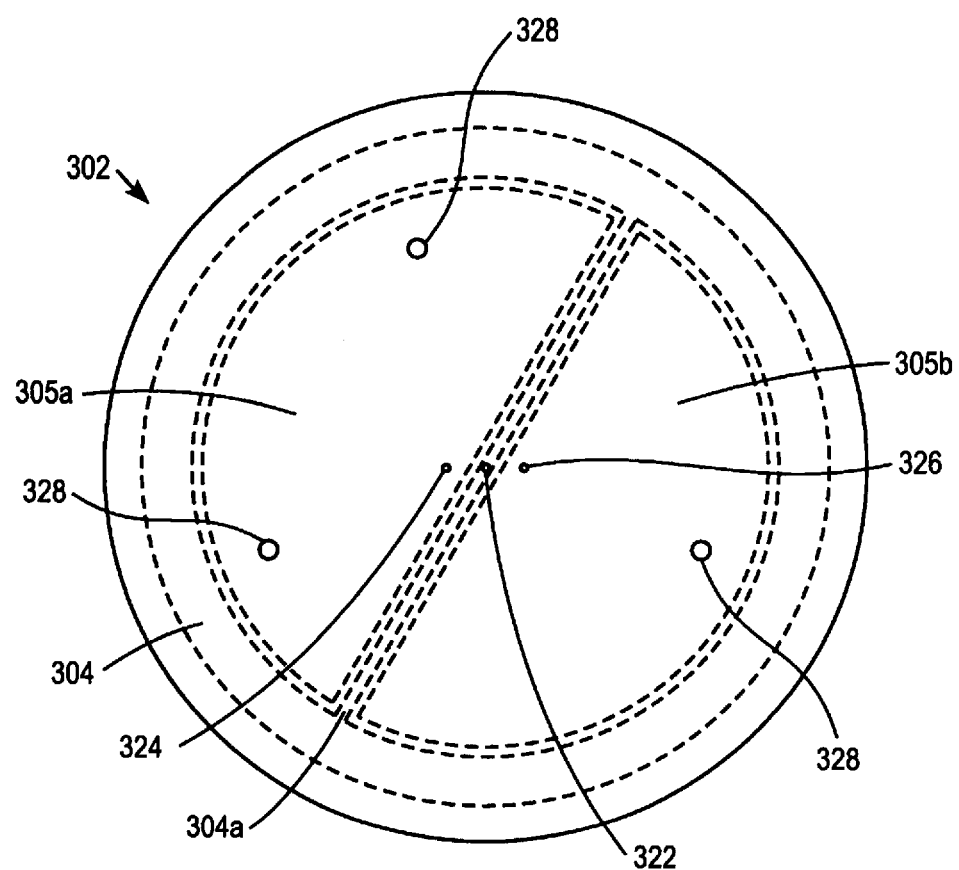
FIG. 9 is a top view of a substrate support in accordance with an embodiment wherein an outer ring-shaped electrode includes a diagonal feed strip which is supplied power by a central metallize ceramic tube which delivers inert gas through a passage in the feed strip.

FIG. 9 is a top view of a substrate support in accordance with an embodiment wherein the platen 302 includes three coplanar electrodes and three metallized ceramic tubes which supply power to the electrodes. In this embodiment, the platen 302 includes first, second and third coplanar electrodes 304/305a/305b wherein the first electrode is an outer ring-shaped electrode 304 having a diagonally extending feed strip 304a electrically connected to the first metalized ceramic tube 308 (see FIG. 2) and the second and third electrodes are inner D-shaped electrodes 305a/305b electrically connected to the second and third metallized ceramic tubes 316a/316b (see FIG. 3). The first metallized ceramic tube 308 is in fluid communication with the first gas passage 312 extending though the diagonally extending feed strip 304a and a first outlet 322 at a center of the upper surface 302b of the platen 302. The second metallized ceramic tube 316a is in fluid communication with a second gas passage extending through the second electrode 305a and a second outlet 324 in the upper surface of the platen 302 at a first distance from the first outlet 322. The third metallized ceramic tube 316b is in fluid communication with a third gas passage extending through the third electrode 305b and a third outlet 326 in the upper surface of the platen 302 at a second distance from the first outlet 322. The first and second distances are preferably no greater than about 1 inch, more preferably the second and third outlets 324/326 are spaced about 0.75 inch from the first outlet 322. The platen 302 also includes three lift pin holes 328 through which lift pins can raise and lower a wafer onto the platen 302.

The metallized ceramic tubes 308/316 and feed rods 314 can be used to supply radio-frequency (RF), direct current (DC) and/or alternating current (AC) to electrodes embedded in the platen 302. Additionally, a thermocouple or other sensor can be housed in a metallized ceramic tube which also supplies power to an electrode embedded in the platen 302. The platen 302 is preferably a unitary body of sintered ceramic material such as aluminum oxide (alumina), yttria, aluminum nitride, boron nitride, silicon oxide, silicon carbide, silicon nitride, titanium oxide, zirconium oxide, or other suitable material or combination of materials. Each electrode can have a planar or non-planar configuration and is preferably made of an electrically conductive metallic material (e.g., tungsten, molybdenum, tantalum, niobium, cobalt) or electrically conductive non-metallic material (e.g., aluminum oxide-tantalum carbide, aluminum oxide-silicon carbide, aluminum nitride-tungsten, aluminum nitride-tantalum, yttrium oxide-molybdenum). The electrodes can be formed from powder materials which are co-fired with the ceramic material of the pedestal. For example, the electrodes can be formed of conductive paste which is co-fired with layers of the ceramic material forming the body of the pedestal. For example, the paste can include conductive metal powder of nickel (Ni), tungsten (W), molybdenum (Mo), titanium (Ti), manganese (Mn), copper (Cu), silver (Ag), palladium (Pd), platinum (Pt), rhodium (Rh), Alternatively, the electrodes can be formed from a deposited material having a desired electrode pattern or a deposited film which is etched to form a desired electrode pattern. Still yet, the electrodes can comprise preformed grids, plates, wire mesh, or other suitable electrode material and/or configuration. In an embodiment, the electrodes include at least one electrostatic clamping electrode which is powered by a DC power source to provide DC chucking voltage (e.g., about 200 to about 2000 volts), at least one RF electrode powered by a RF power source to provide RF bias voltage (e.g., one or more frequencies of about 400 KHz to about 60 MHz at power levels of about 50 to about 3000 watts) and/or at least one electrode powered by DC and RF power sources via suitable circuitry. The metallized ceramic tube can have a conductive metallized coating on its inner surface, outer surface or inner and outer surfaces. To connect the conductive metallized coating to an embedded electrode, the conductive metallized coating can be mechanically or metallurgically joined directly to the electrode or a terminal thereof located at an underside of the pedestal. For example, the conductive metallized coating can be brazed to a terminal attached to the embedded electrode.

While the substrate pedestal module of the semiconductor substrate processing apparatus has been described in detail with reference to specific embodiments thereof, it will be apparent to those skilled in the art that various changes and modifications can be made, and equivalents employed, without departing from the scope of the appended claims.

What is claimed is:

1. A module useful for processing semiconductor substrates in a vacuum chamber including a processing zone in which a semiconductor substrate may be processed, the module comprising:
    a ceramic body;
    a stem made of ceramic material having a flange bonded to the ceramic body; and
    at least one metallized ceramic tube configured to supply gas to the ceramic body and supply power to an electrode embedded in the ceramic body.

2. The module of claim 1, wherein the electrode is an electrostatic clamping electrode.

3. The module of claim 1, wherein the electrode is an RF electrode.

4. The module of claim 1, wherein the ceramic body includes one or more resistance heaters embedded therein and the heaters are electrically connected to metallized ceramic feed rods or metal feed rods.

5. The module of claim 1, further comprising a thermocouple configured to measure temperature of the ceramic body, the thermocouple located inside a ceramic tube attached to the ceramic body.

6. The module of claim 1, wherein the metalized ceramic tube, the ceramic body and the stem are formed of aluminum nitride.

7. The module of claim 1, wherein the metalized ceramic tube is centrally located in the interior of the stem.

8. The module of claim 1, wherein the ceramic body includes an outer electrode embedded therein and inner electrodes embedded therein, the inner electrodes coplanar with the outer electrode, the outer electrode electrically connected to a metallized ceramic power feed rod inside the stem, and each of the inner electrodes electrically connected to a pair of metallized ceramic feed rods inside the stem.

9. The module of claim 1, wherein the metallized ceramic tube is connected to the electrode by a stress relief connection, the stress relief connection configured to change shape to accommodate differential thermal expansion between the metallized ceramic tube and the electrode.

10. The module of claim 1, wherein the metallized ceramic tube has a length greater than a length of the stem and the metallized ceramic tube includes an electrically conductive coating only on an outer surface thereof.

11. The module of claim 1, wherein the at least one metalized ceramic tube comprises first, second and third metallized ceramic tubes and the ceramic body includes first, second and third coplanar electrodes wherein the first electrode is an outer ring-shaped electrode having a diagonally extending feed strip electrically connected to the first metalized ceramic tube and the second and third electrodes are inner D-shaped electrodes electrically connected to the second and third metallized ceramic tubes.

* * * * *